(12) United States Patent
Brown

(10) Patent No.: US 6,434,074 B1
(45) Date of Patent: Aug. 13, 2002

(54) SENSE AMPLIFIER IMBALANCE COMPENSATION FOR MEMORY SELF-TIMED CIRCUITS

(75) Inventor: Jeff Brown, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/946,759

(22) Filed: Sep. 4, 2001

(51) Int. Cl.[7] ................................................. G11C 7/14
(52) U.S. Cl. ....................... 365/210; 365/190; 365/233; 365/194; 365/195; 365/196
(58) Field of Search .............................. 365/233, 233.5, 365/210, 206, 205, 190, 196, 195, 191, 194, 226, 227

(56) References Cited

U.S. PATENT DOCUMENTS

| | | | | |
|---|---|---|---|---|
| 5,257,232 A | * | 10/1993 | Dhong et al. ............... | 365/203 |
| 5,297,077 A | * | 3/1994 | Imai et al. .................. | 365/145 |
| 5,386,388 A | * | 1/1995 | Atwood et al. ............. | 365/201 |
| 5,596,539 A | * | 1/1997 | Passow et al. .............. | 365/210 |
| 6,240,007 B1 | * | 5/2000 | Kang .......................... | 365/145 |
| 6,181,626 B1 | * | 1/2001 | Brown ........................ | 365/210 |
| 6,215,692 B1 | * | 4/2001 | Kang .......................... | 365/145 |
| 6,229,746 B1 | * | 5/2001 | Tooher ....................... | 365/210 |

* cited by examiner

Primary Examiner—Andrew Q. Tran
(74) Attorney, Agent, or Firm—Carstens, Yee & Cahoon, LLP

(57) ABSTRACT

A mechanism is provided for self timing a memory circuit to compensate for sense amplifier imbalance. The self timing mechanism comprises two self timed sense amplifiers. A first self timed sense amplifier reads a first state and a second self timed sense amplifier reads a second state. The control logic deactivates the real sense amplifiers in response to the slower of the two self timed sense amplifiers. Thus, even if there is a layout or processing variance, which causes the sense amplifiers to have a non-zero offset voltage and favor a certain output state when the inputs are equal, the real sense amplifiers are able to read the states of the memory cell.

20 Claims, 3 Drawing Sheets

SENSE AMPLIFIER IMBALANCE COMPENSATION FOR MEMORY SELF-TIMED CIRCUITS

BACKGROUND OF THE INVENTION

1. Technical Field

The present invention relates to memory circuits and, in particular, to self timed memories. Still more particularly, the present invention provides a method and apparatus for sense amplifier imbalance compensation for memory self time circuits.

2. Description of the Related Art

Many computer devices operate based on an external clock. For example, a processor may receive a clock input and perform all operations or events only when the clock transitions. Devices in which events proceed based on a clock transition are referred to as "synchronous" devices. Other computer devices do not base their operation on an external clock. These devices are referred to as "asynchronous" or "self timed" devices. A memory is an example of a device that can be implemented as a self timed device. A self timed memory typically receives a request from a processor (e.g., a read or write request). The memory array then performs the operation and indicates to the processor when the operation is complete. However, the time required for the operation to complete is not based on an external clock (i.e., a predetermined number of clock cycles). Rather, the time required is based on the asynchronous delay paths through the device, which may vary in duration based on the operations that are performed.

The central part of a memory is the memory cell array. Today's memory devices typically include at least one memory cell array organized in rows and columns of memory cells, with each row of memory cells being connected to a distinct word line and each column of memory cells being connected to a distinct bit line or bit line pair. Address decode circuitry is included to select a word line based upon the value of the address provided to the memory device. A distinct sense amplifier (amp) is connected to each pair of bit lines and amplifies the differential voltage placed thereon from accessing a memory cell. The sense amplifiers connected to the bit lines of the memory cells are referred to as "real sense amps."

A self timed memory device may include a dummy bit that is used to indicate when an operation is completed. A sense amplifier is then connected to the pair of bit lines for the dummy bit. The sense amplifier amplifies the signal and returns this signal to the control logic of the memory device to turn off the sense amps of the memory cell array. The sense amplifier is said to be "sensing" or "looking for" a state. However, due to analog sense amplifier imbalance, a sense amplifier may favor one state and be slow at determining the other state. Due to the manner in which the memory chip is fabricated, all sense amplifiers may be imbalanced uniformly. Thus, if the sense amplifier for the dummy bit is looking for a first state and one of the memory cells stores a second state, the sense amplifier for the dummy bit may sense the first state before the real sense amplifier for the memory cell senses the second state.

Prior art methods for solving the problem of sense amplifier imbalance add margin to the self timing path to slow down the self timed sense amplifier by a fixed delay. However, these prior art methods do not track with any imbalance that may be present in the sense amplifiers associated with the memory cells due to processing, layout mismatches, etc. Therefore, it would be advantageous to provide an improved method and apparatus for sense amplifier imbalance compensation for memory self time circuits.

SUMMARY OF THE INVENTION

The present invention provides a mechanism for self timing a memory circuit to compensate for sense amplifier imbalance. The self timing mechanism comprises two self timed sense amplifiers. A first self timed sense amplifier reads a first state and a second self timed sense amplifier reads a second state. The control logic deactivates the real sense amplifiers in response to the slower of the two self timed sense amplifiers. Thus, even if there is a layout or processing variance, which causes the sense amplifiers to have a non-zero offset voltage and favor a certain output state when the inputs are equal, the real sense amplifiers are able to read the states of the memory cell.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

Figure 1:
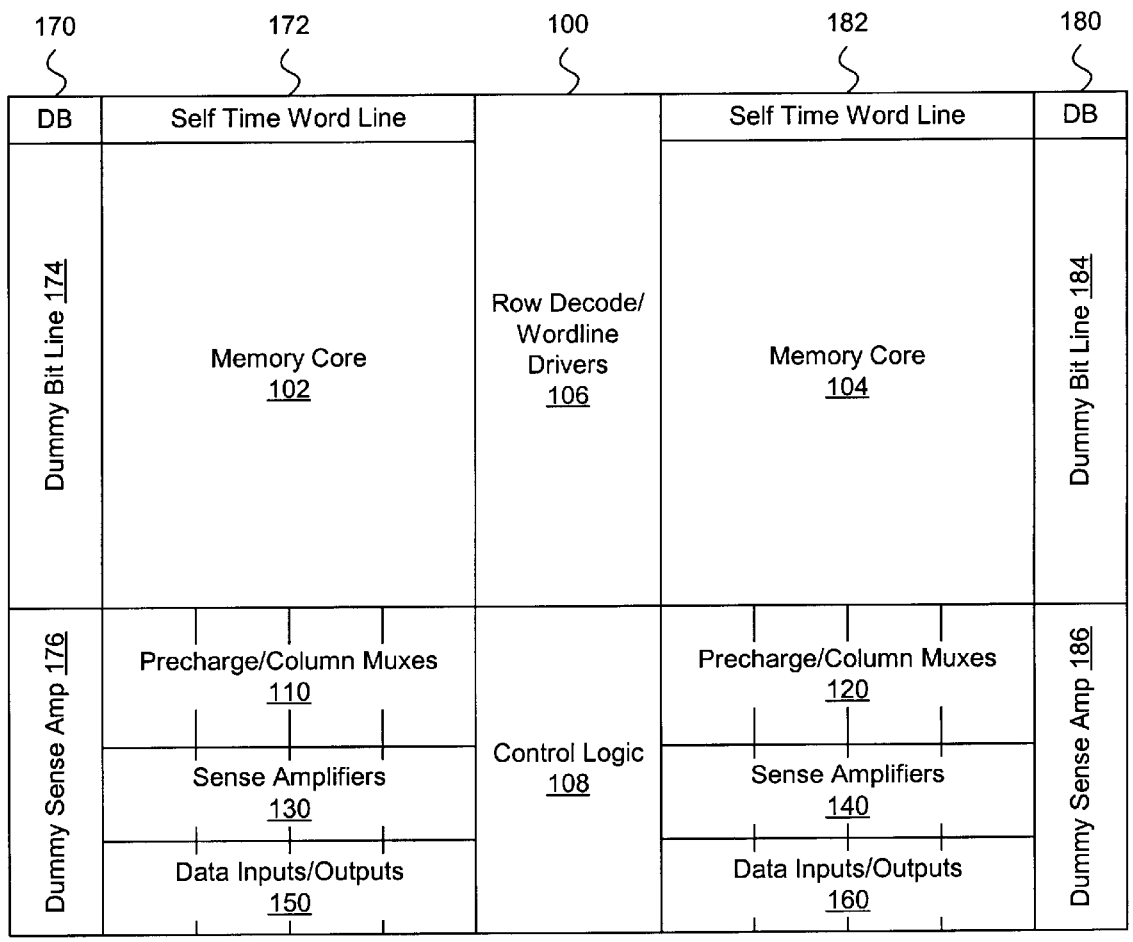
FIG. 1 is a block diagram illustrating a self timed memory in accordance with a preferred embodiment of the present invention.

With reference now to the figures and in particular with reference to FIG. 1, a block diagram is shown illustrating a self timed memory in accordance with a preferred embodiment of the present invention. Memory 100 includes memory core 102 and memory core 104. Each memory core includes a memory cell array of rows and columns of memory cells. Row decode/wordline drivers 106 determine the row in the memory core to read and asserts the appropriate word line. Control logic 108 selects the appropriate column through communication with precharge/column multiplexors 110, 120. Control logic also activates and deactivates sense amplifiers 130, 140. Sense amplifiers 130, 140 are referred to as "real sense amps." Memory 100 also includes data inputs/outputs 150, 160. Data inputs/outputs 150, 160 may buffer the outputs.

Memory 100 is a self timed memory device. Memory 100 includes dummy bit 170 that is self timed by self time word line 172. Row decode/wordline drivers 106 assert self time word line 172 at the beginning of a read along with the wordline associated with the row being read. Dummy bit 170 is connected to dummy bit line 174. Dummy sense amp 176 reads dummy bit line 174. Thus, dummy bit 170 may store a zero and dummy sense amp 176 may look for a zero state on dummy bit line 174. When dummy sense amp 176 reads a zero state, it is likely that real sense amps 130, 140 have also read their values. Therefore, dummy sense amp 176 indicates that the read is completed and dummy sense amp 176 may signal control logic 108 to deactivate the real sense amps in response to sensing a zero state on dummy bit line 174.

However, the sense amplifiers may have a non-zero offset voltage and favor a certain output state when the inputs are equal. In other words, the sense amplifiers may favor one state and be slow at determining the other state. Due to the manner in which the memory chip is fabricated, all sense amplifiers may be imbalanced uniformly. Thus, if dummy sense amp 176 is looking for a first state and one of the memory cells stores a second state, dummy sense amp 176 may favor the first state and sense the first state before the real sense amp for the memory cell senses the second state. In the above example, dummy sense amp 176 may sense a zero state causing control logic 108 to deactivate sense amplifiers 130, 140 before one of the real sense amps is able to sense a one state.

In accordance with a preferred embodiment of the present invention, memory 100 includes a second dummy bit, dummy bit 180 that is self timed by self time word line 182. Row decode/wordline drivers 106 also assert self time word line 182 at the beginning of the read. Dummy bit 180 is connected to dummy bit line 184. Dummy sense amp 186 reads dummy bit line 184. Thus, dummy bit 180 may store a one state and dummy sense amp 186 may look for a one state on dummy bit line 184 to indicate that a read is completed. Dummy sense amp 186 also signals control logic 108 to deactivate the real sense amps in response to sensing a one state on dummy bit line 184.

Because the sense amps will typically be uniformly imbalanced, dummy sense amp 176 and dummy sense amp 186 will favor the same state. Therefore, control logic 108 may then deactivate the real sense amps in response to the slower of the two self timed sense amplifiers 176, 186. All of the real sense amps will read their respective bit lines at least as quickly as the slower of the dummy sense amps. As a result, sense amplifiers 130, 140 are able to read the memory cells regardless of the state the sense amps favor.

Figure 2:
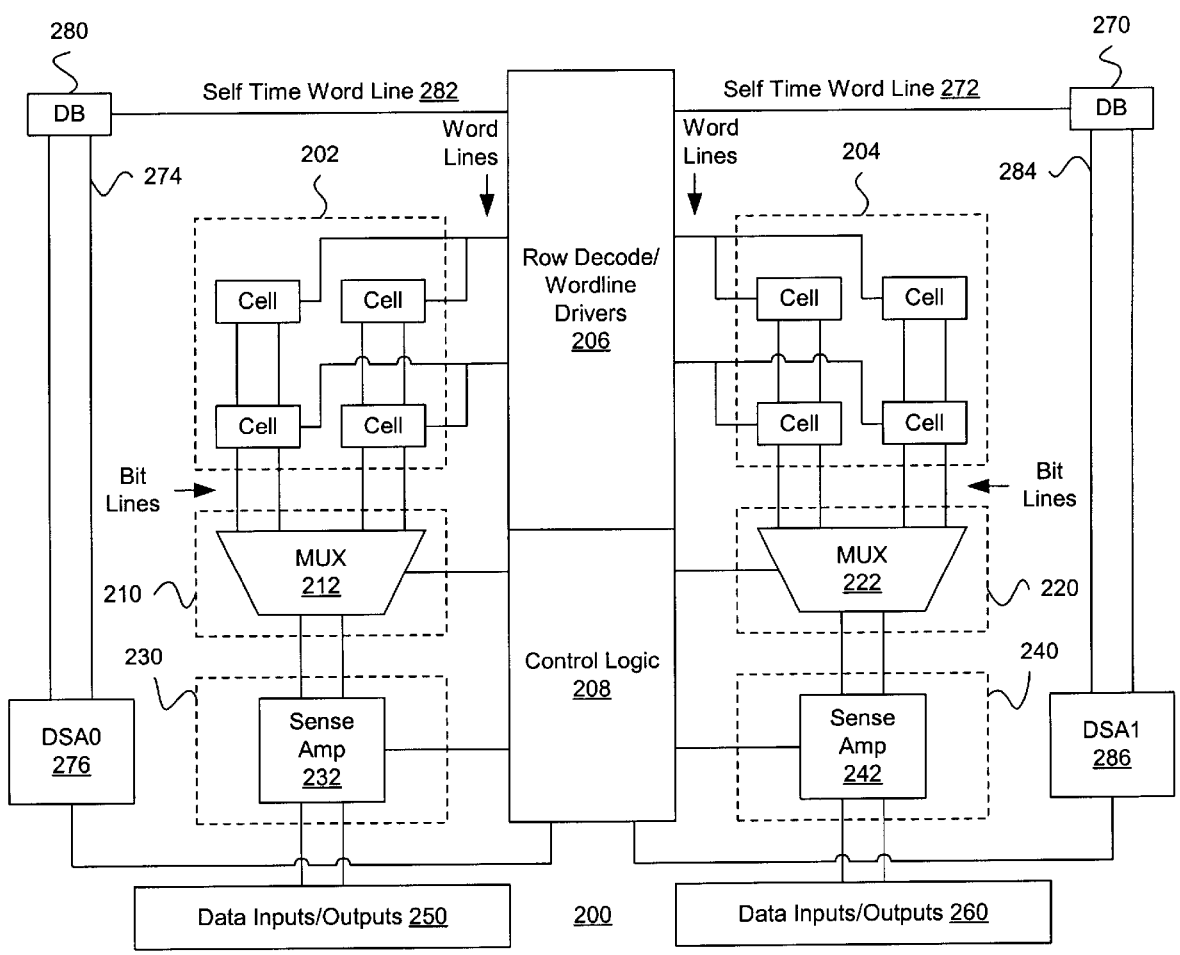
FIG. 2 is a simplified circuit diagram of an example memory in accordance with a preferred embodiment of the present invention.

With reference now to FIG. 2, a simplified circuit diagram of an example memory is shown in accordance with a preferred embodiment of the present invention. Memory 200 includes memory core 202 and memory core 204. Each memory core includes a memory cell array of rows and columns of memory cells. In the simplified example shown in FIG. 2, each memory core includes two rows and two columns; however, a typical memory chip will include many more rows and columns. For example, a 4 Mbyte chip has 4,194,304 memory cells arranged in an array of 2048 rows and 2048 columns. Row decode/wordline drivers 206 determine the row in the memory core to read and asserts the appropriate word line. Control logic 208 selects the appropriate column through communication with precharge/column multiplexors 210, 220. Precharge/column multiplexors 210 include multiplexor 212 and precharge/column multiplexors 220 include multiplexor 222. Control logic also activates and deactivates sense amplifiers 230, 240. Sense amplifiers 230 include sense amp 232 and sense amplifiers 240 include sense amp 242. Memory 200 also includes data inputs/outputs 250, 260. In the example shown in FIG. 2, data inputs/outputs 250, 260 include two output bits; however, the memory may include more or fewer output bits. For example, a memory chip may have eight output bits.

Before a memory cell is accessed, a precharge circuit may charge all bit line pairs up to the supply voltage. The bit line pairs may also be short circuited to ensure that each bit line pair is at an equal potential. When a memory cell is accessed, the row decoder decodes the row address and activates the appropriate word line, as well as self time word lines 272, 282, causing the potential of the bit lines to change. The sense amps activated by control logic 208 amplify the potential difference on the bit line pairs.

Memory 200 also includes dummy bits 270, 280 that are timed by self time word lines 272, 282. Dummy bit 270 is connected to bit lines 274 and dummy bit 280 is connected to bit lines 284. Dummy sense amp DSA0 276 looks for a first state on bit lines 274 and dummy sense amp DSA1 286 looks for a second state on bit lines 284. In other words, dummy bits 270, 280 store opposite states. Control logic 208 deactivates sense amps 232, 242 in response to the slower of DSA0 and DSA1.

Figure 3:
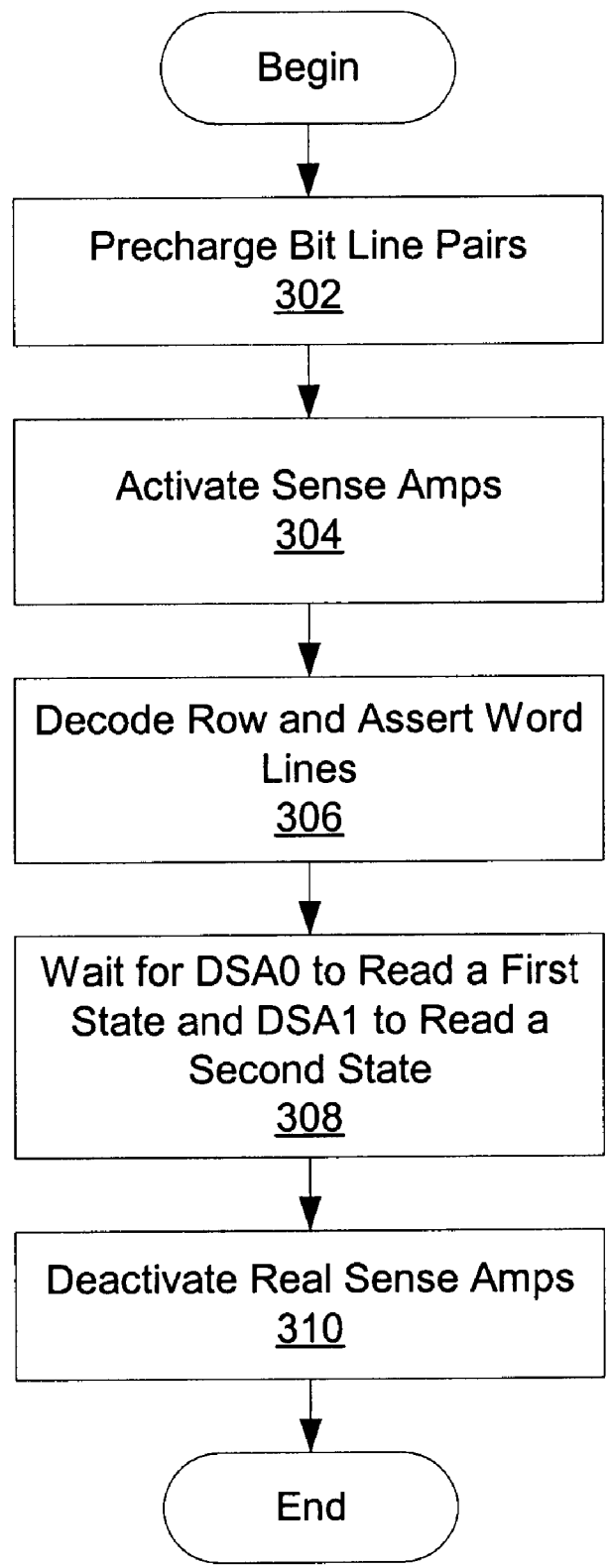
FIG. 3 is a flowchart illustrating the operation of a memory in accordance with a preferred embodiment of the present invention.

Turning to FIG. 3, a flowchart illustrating the operation of a memory is shown in accordance with a preferred embodiment of the present invention. The process begins and precharges the bit line pairs (step 302). Next, the process activates the sense amps, including the dummy sense amps (step 304). Then, the process decodes the row and asserts the appropriate word lines, including the self time word lines (step 306). The process then waits for the first dummy sense amp to read a first state and the second dummy sense amp to read a second state (step 308). In response to the slower of the first dummy sense amp and the second dummy sense amp, the process deactivates the real sense amps (step 310) and ends.

Thus, the present invention solves the disadvantages of the prior art by providing a mechanism for self timing a memory circuit to compensate for sense amplifier imbalance. The self timing mechanism comprises two self timed sense amplifiers. A first self timed sense amplifier reads a first state and a second self timed sense amplifier reads a second state. The control logic deactivates the real sense amplifiers in response to the slower of the two self timed sense amplifiers. Thus, even if there is a layout or processing variance, which causes the sense amplifiers to have a non-zero offset voltage and favor a certain output state when the inputs are equal, the real sense amplifiers are able to read the states of the memory cell. The present invention will track any imbalance that may be present in the real sense amplifiers. Furthermore, the present invention compensates for sense amplifier imbalance without applying a fixed delay.

One of ordinary skill in the art will also recognize that the present invention has a wider range of applicability than memory circuits. There are numerous self timed circuits where a convenient sense amp imbalance compensation technique is needed. The present invention is applicable in any self timed circuit where sense amps are used to time the inputs and/or outputs.

The description of the preferred embodiments of the present invention has been presented for purposes of illustration and description, but is not limited to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

What is claimed is:

1. A method for timing a circuit, comprising:
   activating a plurality of sense amplifiers including at least one real sense amplifier, a first dummy sense amplifier, and a second dummy sense amplifier, wherein the at least one real sense amplifier senses data;
   waiting for the first dummy sense amplifier to sense a first state and the second dummy sense amplifier to sense a second state; and deactivating the at least one real sense amplifier in response to the slower of the first dummy sense amplifier and the second dummy sense amplifier.

2. The method of claim 1, further comprising:

decoding a row address; and asserting a word line corresponding to the row address.

3. The method of claim 1, wherein the at least one real sense amplifier reads a pair of bit lines from a memory cell.

4. The method of claim 1, wherein the first dummy sense amplifier reads a pair of bit lines from a first dummy bit and the second dummy sense amplifier reads a pair of bit lines from a second dummy bit.

5. The method of claim 4, wherein the first dummy bit and the second dummy bit store opposite values.

6. The method of claim 4, further comprising:

asserting a first self time word line corresponding to the first dummy bit and a second self time word line corresponding to the second dummy bit.

7. A self timed circuit, comprising:

at least one real sense amplifier, wherein the at least one real sense amplifier senses data;

a first dummy sense amplifier;

a second dummy sense amplifier; and a controller, wherein the controller activates the at least one real sense amplifier, the first dummy sense amplifier, and the second dummy sense amplifier, waits for the first dummy sense amplifier to sense a first state and the second dummy sense amplifier to sense a second state, and deactivates the at least one real sense amplifier in response to the slower of the first dummy sense amplifier and the second dummy sense amplifier.

8. The self timed circuit of claim 7, wherein the at least one real sense amplifier reads a pair of bit lines from a memory cell.

9. The self timed circuit of claim 8, wherein the memory cell is part of a memory cell array.

10. The self timed circuit of claim 9, further comprising:

a row decoder, wherein the row decoder decodes a row address and asserts a word line corresponding to the row address to select a row in the memory cell array.

11. The self timed circuit of claim 9, wherein the controller selects a column in the memory cell array.

12. The self timed circuit of claim 7, wherein the first dummy sense amplifier reads a pair of bit lines from a first dummy bit and the second dummy sense amplifier reads a pair of bit lines from a second dummy bit.

13. The self timed circuit of claim 12, wherein the first dummy bit and the second dummy bit store opposite values.

14. The self timed circuit of claim 12, further comprising:

a row decoder, wherein the row decoder asserts a first self time word line corresponding to the first dummy bit and a second self time word line corresponding to the second dummy bit.

15. A self timed memory, comprising:

a memory cell array;

a first dummy bit;

a second dummy bit;

a plurality of real sense amplifiers, coupled to the memory cell array by pairs of bit lines, wherein the plurality of real sense amplifiers read data from the memory cell array;

a first dummy sense amplifier, coupled to the first dummy bit by a first pair of dummy bit lines, wherein the first dummy sense amplifier looks for a first state on the first pair of dummy bit lines;

a second dummy sense amplifier, coupled to the second dummy bit by a second pair of dummy bit lines, wherein the second dummy sense amplifier looks for a second state on the second pair of dummy bit lines; and a controller, wherein the controller activates the plurality of real sense amplifiers, the first dummy sense amplifier, and the second dummy sense amplifier, waits for the first dummy sense amplifier to sense the first state and the second dummy sense amplifier to sense the second state, and deactivates the plurality of real sense amplifiers in response to the slower of the first dummy sense amplifier and the second dummy sense amplifier.

16. The self timed memory of claim 15, further comprising:

a row decoder, wherein the row decoder decodes a row address and asserts a word line corresponding to the row address to select a row in the memory cell array.

17. The self timed memory of claim 16, wherein the row decoder asserts a first self time word line corresponding to the first dummy bit and a second self time word line corresponding to the second dummy bit.

18. The self timed memory of claim 15, wherein the controller selects a column in the memory cell array.

19. The self timed memory of claim 15, wherein the first dummy bit and the second dummy bit store opposite values.

20. An apparatus for timing a circuit, comprising:

means for activating a plurality of sense amplifiers including at least one real sense amplifier, a first dummy sense amplifier, and a second dummy sense amplifier, wherein the at least one real sense amplifier senses data;

means for waiting for the first dummy sense amplifier to sense a first state and the second dummy sense amplifier to sense a second state; and means for deactivating the at least one real sense amplifier in response to the slower of the first dummy sense amplifier and the second dummy sense amplifier.

\* \* \* \* \*